US009666608B2

(12) United States Patent
Hoka et al.

(10) Patent No.: US 9,666,608 B2
(45) Date of Patent: May 30, 2017

(54) ARRAY SUBSTRATE AND DISPLAY DEVICE

(71) Applicant: MITSUBISHI ELECTRIC CORPORATION, Tokyo (JP)

(72) Inventors: Naruhito Hoka, Tokyo (JP); Manabu Tanahara, Tokyo (JP); Takeshi Shimamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/071,367

(22) Filed: Nov. 4, 2013

(65) Prior Publication Data

US 2014/0159070 A1    Jun. 12, 2014

(30) Foreign Application Priority Data

Dec. 10, 2012    (JP) ................................. 2012-268984

(51) Int. Cl.
| | | |
|---|---|---|
| *H01L 27/12* | (2006.01) | |
| *G02F 1/13* | (2006.01) | |
| *G02F 1/1362* | (2006.01) | |
| *G02F 1/1343* | (2006.01) | |

(52) U.S. Cl.
CPC ...... *H01L 27/124* (2013.01); *G02F 1/136227* (2013.01); *G02F 1/136286* (2013.01); *G02F 2001/134372* (2013.01)

(58) Field of Classification Search
None
See application file for complete search history.

(56) References Cited

U.S. PATENT DOCUMENTS

| | | | |
|---|---|---|---|
| 6,933,528 B2 | 8/2005 | Itakura et al. | |
| 7,554,642 B2 * | 6/2009 | Satake | G02F 1/133707 349/139 |
| 8,284,366 B2 | 10/2012 | Ono | |
| 8,462,303 B2 | 6/2013 | Ono | |
| 8,730,422 B2 * | 5/2014 | Park et al. | 349/45 |

(Continued)

FOREIGN PATENT DOCUMENTS

| | | |
|---|---|---|
| CN | 101075054 A | 11/2007 |
| CN | 102053428 A | 5/2011 |

(Continued)

OTHER PUBLICATIONS

The First Office Action issued by the Chinese Patent Office on Dec. 22, 2015, which corresponds to Chinese Patent Application No. 201310523328.7 and is related to U.S. Appl. No. 14/071,367; with English language partial translation.

(Continued)

*Primary Examiner* — Johannes P Mondt
(74) *Attorney, Agent, or Firm* — Studebaker & Brackett PC

(57) ABSTRACT

An array substrate includes a first electrode located above a switching element through a first insulating film, a second electrode located above the first electrode through a second insulating film, and a connection portion that is located to pass through the first insulating film, first electrode, and second insulating film and electrically connects a drain electrode of the switching element and the second electrode. The connection portion is disposed in an avoidance region provided by carving out a gate line connected to the switching element.

9 Claims, 4 Drawing Sheets

(56) References Cited

U.S. PATENT DOCUMENTS

| | | | |
|---|---|---|---|
| 2004/0141130 A1* | 7/2004 | Kawata | G02F 1/136286 349/139 |
| 2009/0009672 A1 | 1/2009 | Chung et al. | |
| 2009/0322995 A1* | 12/2009 | Yonemura | G02F 1/134363 349/96 |
| 2010/0134741 A1 | 6/2010 | Jeong et al. | |
| 2011/0037931 A1 | 2/2011 | Im et al. | |
| 2011/0085121 A1 | 4/2011 | Jeon et al. | |
| 2011/0102724 A1 | 5/2011 | Ono | |
| 2011/0242443 A1 | 10/2011 | Choi et al. | |
| 2011/0242468 A1 | 10/2011 | Choi et al. | |
| 2012/0305947 A1 | 12/2012 | Lee | |
| 2012/0327323 A1 | 12/2012 | Ono | |
| 2013/0128168 A1* | 5/2013 | Kim | G02F 1/133707 349/42 |

FOREIGN PATENT DOCUMENTS

| | | |
|---|---|---|
| CN | 102213872 A | 10/2011 |
| CN | 102809855 A | 12/2012 |
| JP | 2004-170910 A | 6/2004 |
| JP | 3792670 A | 7/2006 |
| JP | 2010-066396 A | 3/2010 |
| JP | 2011-039478 A | 2/2011 |
| JP | 2011-081385 A | 4/2011 |
| JP | 2011-95545 A | 5/2011 |
| JP | 2011-221505 A | 11/2011 |

OTHER PUBLICATIONS

An Office Action; "Notification of Reason(s) for Refusal," issued by the Japanese Patent Office on Jun. 28, 2016, which corresponds to Japanese Patent Application No. 2012-268984 and is related to U.S. Appl. No. 14/071,367; with English language partial translation.

An Office Action; "Notification of Reason(s) for Refusal," issued by the Japanese Patent Office on Nov. 1, 2016, which corresponds to Japanese Patent Application No. 2012-268984 and is related to U.S. Appl. No. 14/071,367; with partial English language translation.

* cited by examiner

F I G. 1
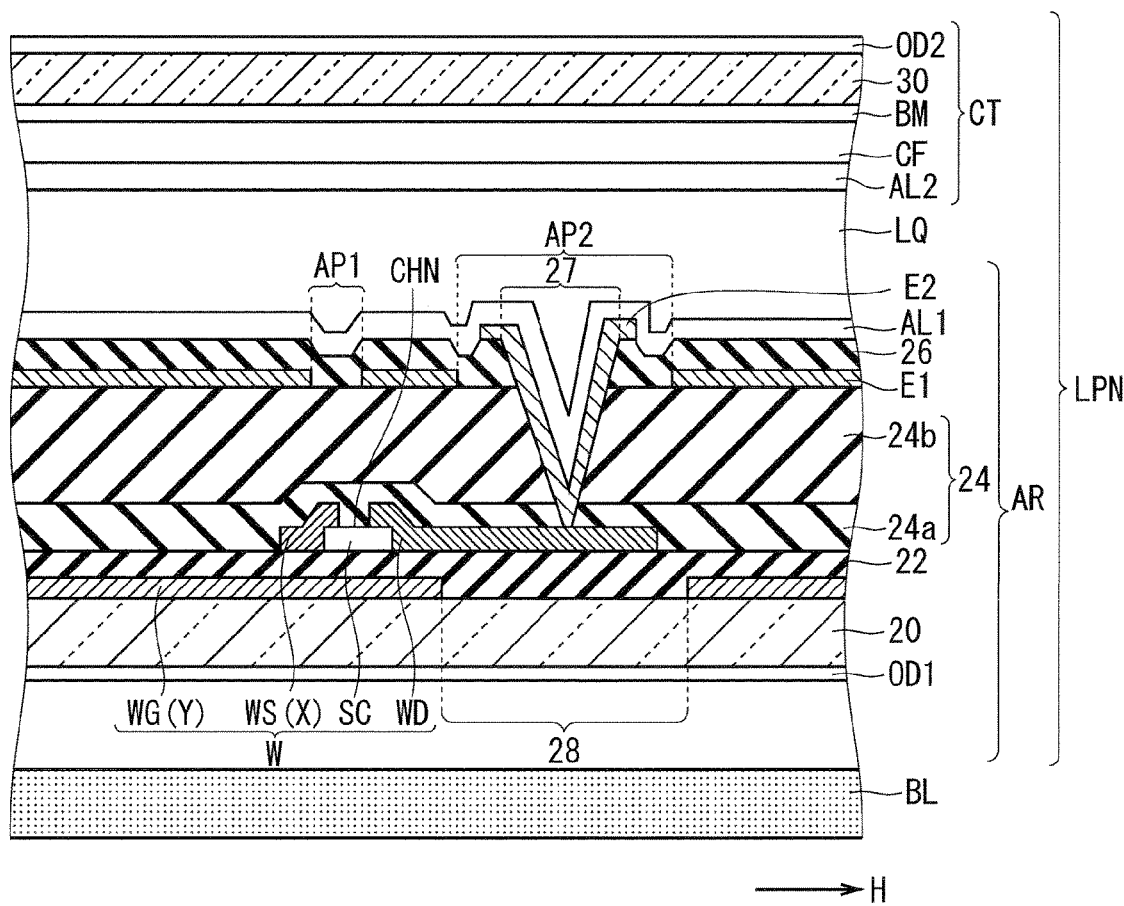

F I G. 4
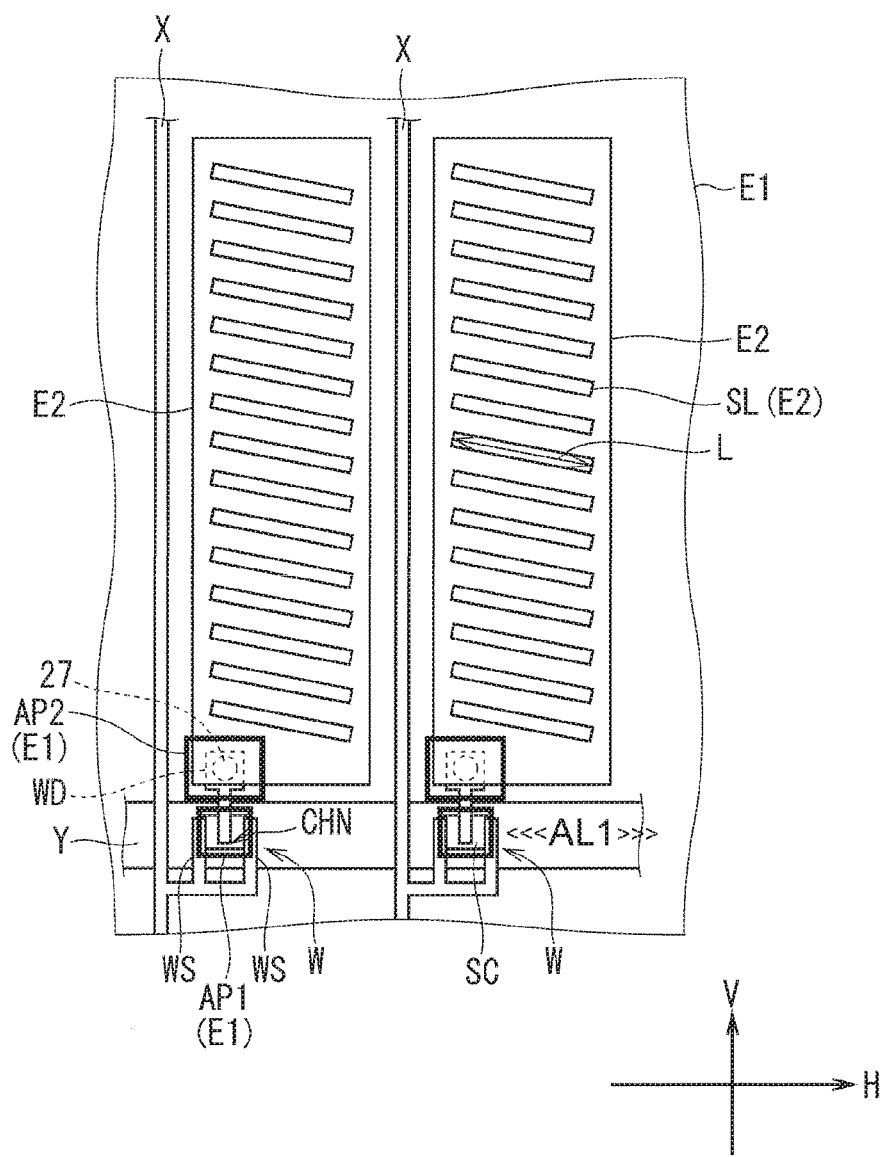
(RELATED ART)

ARRAY SUBSTRATE AND DISPLAY DEVICE

BACKGROUND OF THE INVENTION

Field of the Invention

The present invention relates to an array substrate having a switching element in a display device, and a display device including the same.

Description of the Background Art

The twisted nematic (TN) mode has been widely used as a display type of a liquid crystal display device that is a type of display device. Recently, the transverse electric field type liquid crystal display device has been proposed, in which a voltage is applied between the first and second electrodes provided in one substrate to generate an electric field almost parallel to the panel, whereby the liquid crystal molecules are driven horizontally. The transverse electric field type is advantageous in wider viewing angle, higher resolution and higher brightness and is now becoming mainstream particularly in middle or small sized panels such as smartphones and tablets.

Display types such as in plane switching (IPS) mode and fringe field switching (FFS) mode are known regarding the transverse electric field type liquid crystal display device. Of those, in the FFS mode, a first electrode and a second electrode that has slits are provided with an insulating film therebetween, where those electrodes serve as a pixel electrode and a counter electrode as appropriate. A transverse electric field can be generated in a liquid crystal layer located above the upper electrode through the slits thereof, which allows driving of liquid crystals in accordance with the transverse electric field.

For instance, Japanese Patent Application Laid-Open No. 2010-66396 discloses one example of the transverse electric field type liquid crystal display device. This liquid crystal display device includes a shield electrode provided to prevent the application of a DC electric field, which is generated in response to a high-voltage signal applied to a gate line, to the liquid crystals in its vicinity, and uses the shield electrode as a common wire for connecting common electrodes to the pixels.

In the liquid crystal display device of Japanese Patent Application Laid-Open No. 2010-66396, a second electrode corresponding to a pixel electrode and a drain electrode of a switching element are connected by a connection portion provided in a contact hole, and the connection portion is provided inside a region surrounded by two adjacent gate lines and two adjacent source lines. In this liquid crystal display device, unfortunately, an alignment film formed on a region near the connection portion cannot be rubbed reliably due to the unevenness of the connection portion (contact hole), resulting in a problem that the liquid crystals may not be driven. Under the present circumstances, the light passing through a region where the liquid crystals are not driven is blocked by a counter substrate disposed to face the array substrate. This results in narrower areas for pixels, causing a problem that a pixel aperture ratio decreases.

SUMMARY OF THE INVENTION

The present invention has been made in view of the above-mentioned problems, and an object thereof is to provide the technology capable of improving a pixel aperture ratio, and thus device quality.

The present invention relates to an array substrate having a switching element in a display device, which includes a first electrode located above the switching element through a first insulating film, a second electrode located above the first electrode through a second insulating film, and a connection portion. The connection portion is provided to pass through the first insulating film, the first electrode, and the second insulating film and electrically connects a drain electrode of the switching element and the second electrode. The connection portion is disposed in a predetermined region provided by carving out a gate line connected to the switching element.

The pixel aperture ratio, and thus device quality can be improved.

These and other objects, features, aspects, and advantages of the present invention will become more apparent from the following detailed description of the present invention when taken in conjunction with the accompanying drawings.

BRIEF DESCRIPTION OF THE DRAWINGS

FIG. 1 is a cross-sectional view schematically showing a configuration of a liquid crystal display device according to a first preferred embodiment;

FIG. 4 is an enlarged plan view schematically showing a configuration of a related array substrate.

DESCRIPTION OF THE PREFERRED EMBODIMENT

First Preferred Embodiment

Figure 2:
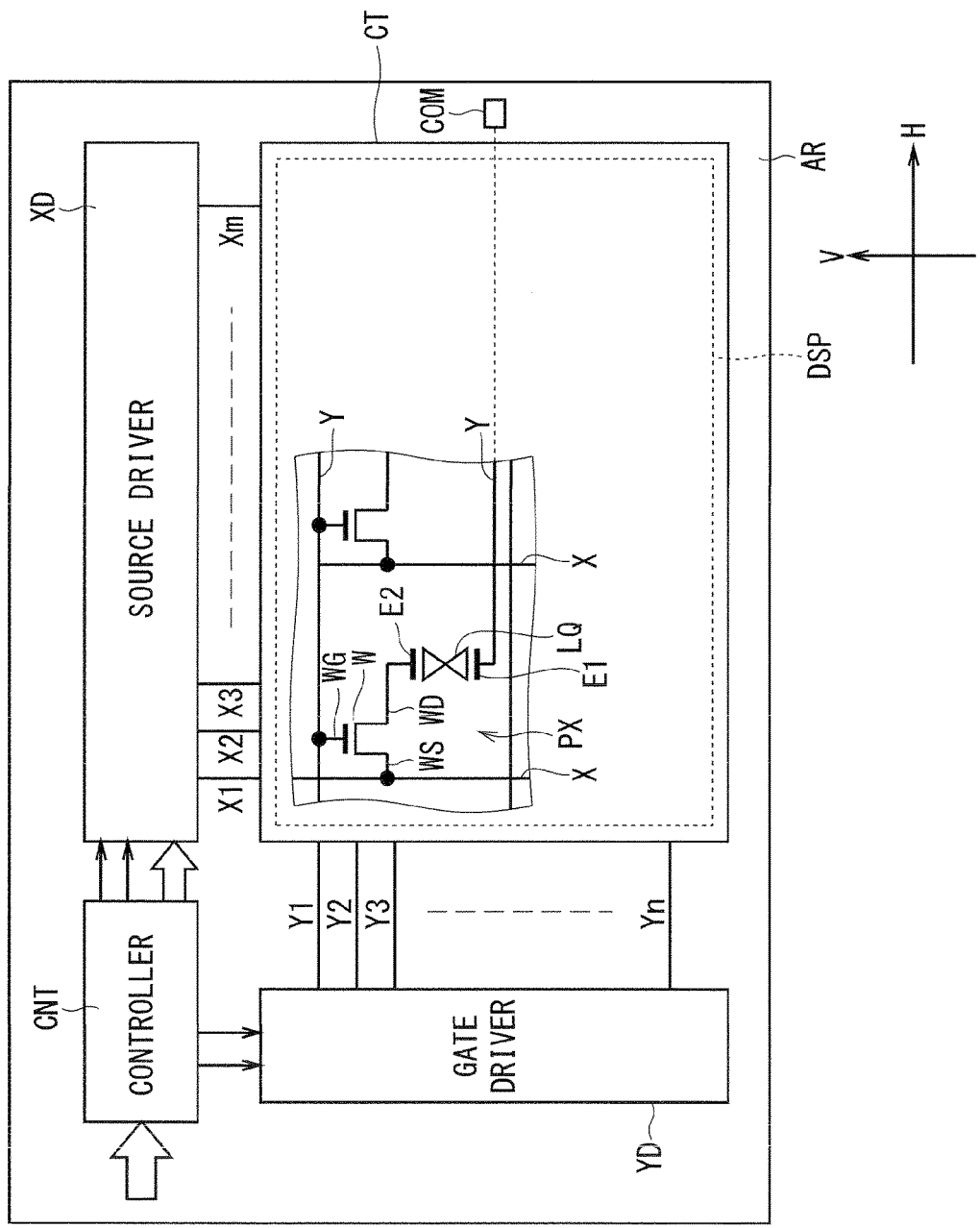
FIG. 2 is a plan view schematically showing a configuration of an array substrate according to the first preferred embodiment.

A case in which the present invention is applied to a liquid crystal display device whose liquid crystal mode is the fringe field switching (FFS) mode is described below as a first preferred embodiment of the present invention. FIG. 1 is a cross-sectional view showing the configuration of the liquid crystal display device according to the first preferred embodiment. FIG. 1 is described schematically and does not correctly reflect, for example, the sizes of elements shown. In addition, the portion other than the main portion of the invention is omitted or partially simplified where appropriate for brevity (the same holds true for the drawings below). Further, in the drawings, like references refer to like or similar elements, and description thereof is omitted.

<Overall Configuration>

As shown in FIG. 1, the liquid crystal display device includes a transmissive liquid crystal display panel LPN and an illumination unit, namely backlight unit BL.

The liquid crystal display panel LPN includes an array substrate (first substrate) AR having switching elements W in the display device, a counter substrate (second substrate) CT located to face the array substrate AR, and a liquid crystal layer LQ held between the array substrate AR and the counter substrate CT. The array substrate AR includes an insulating substrate 20, a first electrode E1 and a second electrode E2 formed thereabove, and the like, where a transverse electric field (electric field almost parallel to the main surface of the substrate) is generated in the liquid crystal layer LQ upon application of a voltage to a portion between the electrodes. In other words, the liquid crystal display panel LPN is an FFS mode liquid crystal display panel that controls the light transmittance of liquid crystal molecules of the liquid crystal layer LQ with the use of, mainly, a transverse electric field. The liquid crystal display panel LPN is described below in detail.

The backlight unit BL is disposed on the array substrate AR side and illuminates the liquid crystal display panel LPN from the array substrate AR side. The above-mentioned backlight unit BL can take various forms. For example, a form in which any of light-emitting diodes (LEDs) and cold-cathode fluorescent lamps (CCFLs) are used as a light source is applicable. The backlight unit BL is not described here in detail.

<Planar Structure of Liquid Crystal Display Panel>

Next, the planar structure of the liquid crystal display panel LPN is described in detail on the assumption that the liquid crystal display panel LPN is an active matrix liquid crystal display panel. FIG. 2 is a plan view schematically showing the configuration of the liquid crystal display panel LPN.

As shown in FIG. 2, the liquid crystal display panel LPN includes a display area (active area) DSP in which images are displayed, and the display area DSP includes m×n (m and n are positive integers) pixels PX arranged in matrix.

The array substrate AR includes n gate lines Y (Y1 to Yn) each extending along a row direction H of each pixel PX, m source lines X (X1 to Xm) each extending along a column direction V of each pixel PX, m×n switching elements W such as thin film transistors (TFTs), and the first electrode E1 and second electrodes E2 described above, which are formed on the insulating substrate 20 inside the display area DSP.

The array substrate AR includes a gate driver YD connected to the gate lines Y (Y1 to Yn) drawn out of the display area DSP, a source driver XD connected to the source lines X (X1 to Xm) drawn out of the display area DSP, and a controller CNT that controls the gate driver YD and the source driver XD, which are formed on the insulating substrate 20 outside the display area DSP.

A gate electrode WG and a source electrode WS of the switching element W are electrically connected to the gate lines Y and the source lines X, respectively. A drain electrode WD of the switching element W is connected to the second electrode E2.

The first electrode E1 is integrally formed over almost the entire display area DSP as described below, to which a common voltage COM supplied from, for example, the controller CNT is applied. Meanwhile, the second electrode E2 is individually formed for each pixel PX as described below, to which a voltage supplied from the drain electrode WD of the switching element W is applied.

In the configuration described above, the gate driver YD successively supplies a scanning signal (drive signal) to the n gate lines Y based on controlling by the controller CNT. Meanwhile, the source driver XD supplies, based on controlling by the controller CNT, a video signal (drive signal) to each of the m source lines X at a timing at which the switching element W of each row turns on in response to the scanning signal. Accordingly, the switching element W that has turned on in response to the scanning signal from the gate line Y can set, to the second electrode E2 connected to the drain electrode WD, a pixel potential corresponding to the video signal from the source line X, namely a pixel potential to the potential of the first electrode E1.

Figure 3:
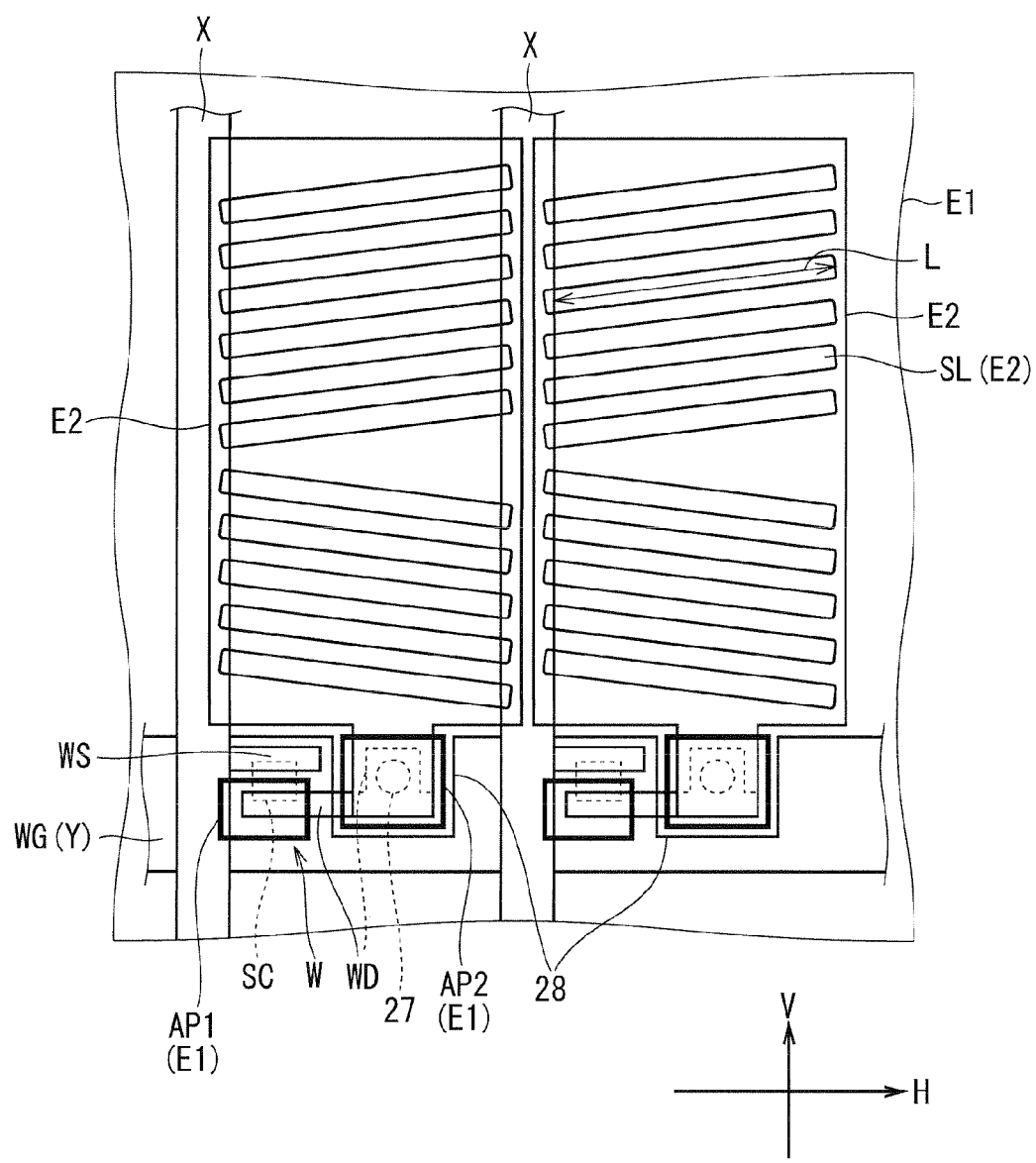
FIG. 3 is an enlarged plan view schematically showing the configuration of the array substrate according to the first preferred embodiment.

FIG. 3 is an enlarged plan view schematically showing the configuration of the liquid crystal display panel LPN.

As shown in FIG. 3, the gate lines Y and source lines X intersect each other. As described below, a gate insulating film 22 (FIG. 1) is formed between the gate lines Y and source lines X so that the gate lines Y and source lines X are electrically insulated from each other even at intersections thereof. The switching element W is disposed near the intersection between the gate line Y and source line X in each pixel PX. In other words, a plurality of switching elements W are provided along the row direction H and column direction V.

As shown in FIG. 3, the first electrode E1 is integrally formed over the almost entire surface of the display area DSP, whereas the second electrode E2 is individually formed for each pixel PX.

<Cross-Sectional Structure of Liquid Crystal Display Panel>

Referring back to FIG. 1, next, the cross-sectional structure of the liquid crystal display panel LPN is described. The cross-sectional structure of the array substrate AR is described first.

The insulating substrate 20 of the array substrate AR is formed of a light transmissive substrate such as glass plate and quartz plate. The gate electrodes WG of the switching elements W and the gate lines Y are formed on the insulating substrate 20. The gate electrode WG and gate line Y are connected to each other (or may be integrally formed on the insulating substrate 20). The gate line Y and gate electrode WG can be formed of the same material (conductive material such as molybdenum, aluminum, tungsten, or titanium) in the same step.

The gate insulating film 22 that covers the gate electrodes WG and gate lines Y is formed thereon. The gate insulating film 22 is formed of, for example, an inorganic material such as silicon nitride (SiN).

A semiconductor layer SC of the switching element W is formed above the gate electrode WG through the gate insulating film 22. The semiconductor layer SC of the switching element W can be formed of, for example, polysilicon or amorphous silicon, and is formed of amorphous silicon herein.

Similarly to the semiconductor layer SC, the source electrode WS, source line X, and drain electrode WD of the switching element W are formed on the gate insulating film 22. Of those, the source electrode WS and the source line X are connected to each other (or may be integrally formed on the gate insulating film 22). The source electrode WS, source line X, and drain electrode WD can be formed of the same material (conductive material such as molybdenum, aluminum, tungsten, or titanium) in the same step.

The source electrode WS and drain electrode WD are respectively connected to two edges of the semiconductor layer SC. The region of the semiconductor layer SC between the source electrode WS and drain electrode WD functions as a channel region CHN in which a carrier flow is controlled in accordance with the gate voltage of the gate electrode WG.

As described above, the first preferred embodiment employs, as the switching element W, a so-called bottom gate type thin film transistor having a structure in which the gate electrode WG is formed on the lower side (insulating substrate 20 side) and the channel region CHN is formed on the upper side (liquid crystal layer LQ side).

A first insulating film 24 that covers the source electrode WS, source line X, drain electrode WD, and semiconductor layer SC is formed thereon. The first insulating film 24 functions as a passivation film and is formed of, for example, a silicon nitride (SiN) film, silicon oxide (SiO) film, or organic insulating film. In the first preferred embodiment, the first insulating film 24 is composed of two insulating layers 24a and 24b.

The first electrode E1 is formed on the first insulating film 24. In other words, the first electrode E1 is located above the switching element W through the first insulating film 24. The first electrode E1 as described above is formed of, for example, a light transmissive conductive material such as indium tin oxide (ITO) or indium zinc oxide (IZO).

The first electrode E1 is formed over the entire display area DSP generally in a solid manner. In other words, the first electrode E1 is formed not only in each pixel PX but also in a portion between the pixels PX and is formed to cover the gate lines Y and source lines X.

It should be noted that as shown in FIG. 1, in the first electrode E1, a first opening (opening) AP1 is provided in the region corresponding to a portion above the channel region CHN of the switching element W, and a second opening AP2 is provided in a region that corresponds to a portion above the drain electrode WD and is remote from the channel region CHN. The first opening AP1 is provided for suppressing the occurrence of an excessive electric field from the first electrode E1 to the channel region CHN to reduce burn-in. The second opening AP2 is provided for forming a connection portion 27 (contact portion) described below. In FIG. 3, the first and second openings AP1 and AP2 are indicated by thick lines.

Referring back to FIG. 1, a second insulating film 26 that covers the first electrode E1 is formed thereon. Similarly to the first insulating film 24, the second insulating film 26 functions as a passivation film and is formed of, for example, a silicon nitride (SiN) film, silicon oxide (SiO) film, or organic insulating film.

The second electrode E2 is formed on the second insulating film 26. In other words, the second electrode E2 is located above the first electrode E1 through the second insulating film 26. Similarly to the first electrode E1, the second electrode E2 as described above is formed of, for example, a light transmissive conductive material such as indium tin oxide (ITO) or indium zinc oxide (IZO).

The second electrode E2 is formed individually for each pixel PX. In the example shown in FIG. 3, the second electrode E2 is formed into an island shape corresponding to the pixel shape, such as a rectangular plane shape in each pixel PX. Disposed on the second electrode E2 are a plurality of slits SL that face the first electrode E1 in the column direction V. The slit SL is formed into, for example, an approximately oblong or oval shape, and a longitudinal axis L thereof is non-parallel to the row direction H and the column direction V in the example shown in FIG. 3.

Referring back to FIG. 1, a connection portion 27 included in the array substrate AR is located to pass through the first insulating film 24, first electrode E1, and second insulating film 26, and electrically connects the drain electrode WD of the switching element W and the second electrode E2. Herein, a contact hole passing through the first insulating film 24, first electrode E1, and second insulating film 26 is formed inside the second opening AP2 of the first electrode E1, and part of the second electrode E2 is extended into the contact hole to be connected to the drain electrode WD, so that the connection portion 27 is formed. The connection portion 27 is not limited to the above but may be formed by providing another conductive member between the second electrode E2 and the drain electrode WD.

A first alignment film AL1 that covers the second electrode E2 is formed thereon. In other words, the first alignment film AL1 (alignment film) included in the array substrate AR is formed on the second electrode E2. The first alignment film AL1 is made of, for example, polyimide.

Next, the cross-sectional structure of the counter substrate CT is described. The counter substrate CT includes a light transmissive insulating substrate 30 such as glass plate or quartz plate. As shown in FIG. 1, particularly in the color display type liquid crystal display device, the counter substrate CT includes, on the surface of the liquid crystal layer LQ side of the insulating substrate 30, a black matrix BM that defines each pixel PX, a color filter layer CF formed correspondingly to each pixel PX surrounded by the black matrix BM. Though not shown herein, the counter substrate CT may include a relatively thick overcoat layer for planarization of an irregular surface of the color filter layer CF.

The black matrix BM is disposed to face a wiring portion including the gate lines Y and source lines X provided in the array substrate AR and the switching elements W. The black matrix BM is formed of, for example, a black colored resin.

The color filter layer CF is formed of colored resins obtained through coloring in a plurality of different colors, for example, red, blue, and green of three primary colors. The red colored resin, blue colored resin, and green colored resin are disposed correspondingly to the red pixel, blue pixel, and green pixel, respectively.

A second alignment film AL2 that covers the color filter layer CF is formed thereon. The second alignment film AL2 is made of, for example, polyimide.

The array substrate AR and counter substrate CT are disposed such that the first alignment film AL1 of the array substrate AR and the second alignment film AL2 of the counter substrate CT face each other. Disposed between the array substrate AR and counter substrate CT is a spacer (such as a columnar spacer formed of a resin material integrally with one substrate, not shown), which allows the formation of a given gap. The array substrate AR and counter substrate CT are bonded to each other via a sealing material with a given gap formed therebetween.

The liquid crystal layer LQ is formed by sealing a liquid crystal composition having positive dielectric anisotropy, which contains liquid crystal molecules, into the gap formed between the first alignment film AL1 of the array substrate AR and the second alignment film AL2 of the counter substrate CT.

The first alignment film AL1 and second alignment film AL2 are rubbed so as to regulate the orientation of the liquid crystal molecules contained in the liquid crystal layer LQ. The liquid crystal molecules are homogeneously oriented with the regulating force by the first alignment film AL1 and second alignment film AL2. The rubbing direction of the first alignment film AL1 and second alignment film AL2 is non-parallel and non-perpendicular to the longitudinal axis of the slit SL. In this embodiment, the first alignment film AL1 is formed through rubbing along the extending direction in which the gate lines Y extend (row direction H shown in FIG. 3).

The array substrate AR includes an optical element OD1 provided on the surface of the insulating substrate 20 on the side opposite to the liquid crystal layer LQ (one outer surface of the liquid crystal display panel LPN). The counter substrate CT includes an optical element OD2 provided on the surface of the insulating substrate 30 on the side opposite to the liquid crystal layer LQ (the other outer surface of the liquid crystal display panel LPN).

Each of the optical elements OD1 and OD2 includes a polarizing plate. This achieves a normally black mode where the light transmittance of the liquid crystal display panel LPN is minimized (that is, black color display appears) in, for example, no electric field state in which no potential difference is caused between the first electrode E1 and second electrode E2 (that is, no electric field is formed between the first electrode E1 and second electrode E2 and in the liquid crystal layer LQ).

In no electric field state in which a potential difference is not caused between the first electrode E1 and second electrode E2, the liquid crystal molecules of the liquid crystal layer LQ are oriented such that the longitudinal axis thereof is directed parallel to the rubbing direction of the first alignment film AL1 and second alignment film AL2. In this state, the back light emitted from the backlight unit BL passes through the optical element OD1, liquid crystal layer LQ, and the like, and then, almost the entire light is absorbed by the optical element OD2 (black color display appears).

Meanwhile, in a case where a potential difference is caused between the first electrode E1 and second electrode E2 (that is, during voltage application in which a voltage having a different potential from that of the first electrode E1 is applied to the second electrode E2), a transverse electric field (fringe electric field) is formed in the liquid crystal layer LQ. The transverse electric field is formed in a direction in which the transverse electric field is directed from one slit SL to another slit SL in the shortest distance, namely a direction perpendicular to the longitudinal axis L1 of the slit SL. On this occasion, the liquid crystal molecules of the liquid crystal layer LQ changes an orientation state such that the longitudinal axis thereof is directed from the rubbing direction to the direction parallel to the transverse electric field. If the direction of the longitudinal axis of the liquid crystal molecules changes from the rubbing direction in this manner, the percentage modulation to the light passing through the liquid crystal layer LQ changes. As a result, the back light emitted from the backlight unit BL passes through the optical element OD1, liquid crystal layer LQ, and the like, and then, part of the back light passes through the optical element OD2 (white color display appears).

The black color display and white color display as described above are selectively caused to appear in each pixel PX, whereby desired images can be displayed on the liquid crystal display panel LPN.

As shown in FIG. 1, in the thus configured array substrate AR, the liquid crystal layer LQ and a liquid crystal driving portion in which the pixels PX are formed are formed above the first electrode E1 (on the counter substrate CT side), and a drive control portion and a wiring portion such as the gate lines Y and source lines X are formed below the first electrode E1 (on the backlight unit BL side). With this configuration, the first electrode E1 can electrically isolate (shield) the liquid crystal layer LQ and the like thereabove from the gate lines Y and the like therebelow.

Here, as shown in FIG. 3, in the array substrate AR according to the first preferred embodiment, the connection portion 27 electrically connecting the drain electrode WD of the switching element W and the second electrode E2 is disposed in the avoidance region (predetermined region) 28 obtained by carving out the gate line Y. This configuration enables to improve the aperture ratio of the pixel PX, and thus the display quality (brightness) of the liquid crystal display device. Next, the effects of this configuration are described through the comparison between the array substrate AR according to the first preferred embodiment and an array substrate related thereto (hereinafter, referred to as "related array substrate").

FIG. 4 is an enlarged plan view schematically showing the configuration of the liquid crystal display panel including the related array substrate. In the related array substrate, the connection portion 27 is provided inside the rectangular region surrounded by two adjacent gate lines Y and two adjacent source lines X. The liquid crystal display device including this related array substrate was prototyped and was driven actually and, as a result, a light leakage (white-out) was confirmed during black color display in the region near the connection portion 27. Analytical results showed that the first alignment film AL1 had not been rubbed reliably in the region near the connection portion 27 due to the unevenness of the connection portion 27 (contact hole).

The inventor(s) have therefore assumed an array substrate in which the connection portion 27 was disposed above the gate line Y. Although the configuration of this array substrate could reduce a region difficult to rubbing, a light leakage still needed to be suppressed.

The inventor(s) have therefore prototyped a liquid crystal display device and then evaluated a light leakage (white-out) during black color display regarding the positional relationship among the gate line Y, counter substrate CT, and first electrode E1 (openings AP1 and AP2 thereof). As a result, it was revealed that a light leakage (white-out) occurred due to the electric field from the gate line Y having reached the liquid crystal layer LQ through the second opening AP2 (region of the connection portion 27) and the first opening AP1. In other words, it was revealed that an electrical shield provided by the first electrode E1 in the region near the connection portion 27 (near the second opening AP2) and in the region near the switching element W (near the first opening AP1) was defective, which caused, for example, a light leakage in those regions.

Consequently, the inventor(s) have assumed the configuration of the array substrate AR according to the first preferred embodiment described above. In other words, the inventor(s) have assumed the array substrate AR in which the connection portion 27 was disposed in the avoidance region 28 provided by carving out the gate line Y. The configuration of the array substrate AR described above can increase a spacing between the region for the connection portion 27 (herein, second opening AP2) and the gate line Y. This prevents an electric field generated from the gate line Y from leaking from the region for the connection portion 27 (herein, second opening AP2), that is, from reaching the liquid crystal layer LQ through that region, suppressing the occurrence of a light leakage in the region near the connection portion 27. Consequently, an effective area can be increased in the pixel PX, improving the aperture ratio of the pixel PX, and thus device quality (brightness) of the liquid crystal display device.

It is preferable that the end of the gate line Y near the avoidance region 28 be covered with the first electrode E1. In other words, the second opening AP2 is preferably provided so as not to overlap the gate line Y in plan view (FIG. 3). The above-mentioned configuration can reliably prevent the electric field generated from the gate line Y from reaching the liquid crystal layer LQ through the second opening AP2. This reliably suppresses the occurrence of a light leakage in the region near the connection portion 27.

Similarly, the first opening AP1 is preferably provided inside the both ends in the line width direction of the gate line Y in plan view (FIG. 3) such that the both ends of the gate line Y are covered with the first electrode E1. This configuration can reduce the size of the first opening AP1, preventing the electric field generated from the gate line Y from reaching the liquid crystal layer LQ through the first opening AP1. Accordingly, the occurrence of a light leakage in the region near the switching element W can be suppressed. In addition, the effect owing to the provision of the first opening AP1, namely the effect of reducing burn-in generated due to an excessive electric field from the first electrode E1 to the channel region CHN can be achieved to some extent.

While it suffices that the first opening AP1 is formed in only a minimum required region of the first electrode E1, which faces the channel region CHN, the positional relationship between the channel region CHN and first opening AP1 may deviate due to, for example, mask alignment during manufacturing. If the first opening AP1 having a slightly larger size than the outer dimension of the channel region CHN is formed in the light of a margin for that deviation, burn-in can be effectively reduced.

Meanwhile, in a case where the gate line Y has a small size and the channel region CHN has a large size, the electric field from the gate line Y cannot be shielded sufficiently. In such a case, the entire channel region CHN may be configured to be covered with the first electrode E1. In other words, the first electrode E1 may be configured to be formed on the entire first insulating film 24 except for the connection portions 27. This configuration can reliably prevent the electric field generated from the gate line Y from reaching the liquid crystal layer LQ through the first opening AP1.

The configuration according to the first preferred embodiment is made so as to include the first alignment film AL1 formed through rubbing along the extending direction (herein, row direction H) of the gate lines Y. This configuration enables to rub the first alignment film AL1 while avoiding the connection portions 27. Accordingly, a region difficult to rubbing can be reduced reliably, preventing the occurrence of a light leakage in the region near the connection portion 27 with reliability.

An FFS mode liquid crystal display device was actually prototyped with the layout shown in FIGS. 1 and 3, and accordingly, a defective display region (namely region including a light leakage) due to defective rubbing could be reduced.

The avoidance region 28 is formed by carving out one-end portion in the line width direction of the gate line Y into a rectangular shape in the example shown in FIG. 3, which is not limited thereto. For example, the avoidance region 28 may be formed by carving out a portion inside the both ends in the line width direction of the gate line Y or have a circular or other shape.

While the invention has been shown and described in detail, the foregoing description is in all aspects illustrative and not restrictive. It is therefore understood that numerous modifications and variations can be devised without departing from the scope of the invention.

What is claimed is:

1. An array substrate having at least one switching element in a display device, comprising:
    a first electrode located above said at least one switching element through a first insulating film;
    a second electrode located above said first electrode through a second insulating film; and
    a connection portion that is located within a single hole passing through said first insulating film, said first electrode, and said second insulating film and electrically connects a drain electrode of said at least one switching element and said second electrode,
    wherein said single hole of said connection portion is disposed in a predetermined region carved out of a gate line so as to be at least partially surrounded by a thin portion of the gate line and two thick portions of the gate line, said thick portions being thicker than said thin portion from a plan view perspective, said thin portion being adjacent to said thick portions, and the gate line is connected to said at least one switching element.

2. The array substrate according to claim 1, wherein an end of said gate line adjacent to said predetermined region is covered with said first electrode.

3. The array substrate according to claim 1, further comprising an alignment film formed on said second electrode and rubbed along an extending direction in which said gate line extends so as to regulate an orientation of liquid crystal molecules contained in the display device.

4. The array substrate according to claim 1, wherein
    switching elements, including the at least one switching element, are provided along a row direction and a column direction, and
    a slit is formed in said second electrode, said slit having a longitudinal axis non-parallel to said row direction and said column direction.

5. The array substrate according to claim 1, wherein
    an opening is provided in a region of said first electrode corresponding to a portion above said at least one switching element, and
    said opening is provided inside both ends in a line width direction of said gate line such that the both ends of said gate line are covered with said first electrode.

6. A display device comprising:
    the array substrate according to claim 1; and
    a counter substrate located to face said array substrate.

7. The array substrate of claim 1, wherein said single hole is a V-shaped groove.

8. The array substrate according to claim 1, wherein said connection portion is not sandwiched between said first insulating film and said second insulating film.

9. The array substrate according to claim 1, wherein said connection portion is separated from said first electrode.

* * * * *